United States Patent
Ohashi

(10) Patent No.: US 11,664,205 B2
(45) Date of Patent: May 30, 2023

(54) SUBSTRATE PROCESSING APPARATUS

(71) Applicant: Kokusai Electric Corporation, Tokyo (JP)

(72) Inventor: Naofumi Ohashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/027,311

(22) Filed: Sep. 21, 2020

(65) Prior Publication Data
US 2022/0028669 A1    Jan. 27, 2022

(30) Foreign Application Priority Data
Jul. 22, 2020  (JP) .............................. JP2020-125019

(51) Int. Cl.
*H01J 37/32* (2006.01)
*C23C 16/511* (2006.01)
(Continued)

(52) U.S. Cl.
CPC .......... *H01J 37/32862* (2013.01); *B08B 5/00* (2013.01); *C23C 16/345* (2013.01);
(Continued)

(58) Field of Classification Search
USPC ............................ 118/723 MW; 156/345.41
See application file for complete search history.

(56) References Cited

U.S. PATENT DOCUMENTS

2007/0113788 A1* 5/2007 Nozawa ............ H01J 37/32238
                                                118/723 MW
2012/0164834 A1  6/2012 Jennings et al.
(Continued)

FOREIGN PATENT DOCUMENTS

| CN | 103069550 A |   | 4/2013 |              |
|----|-------------|---|--------|--------------|
| JP | 2011150943 A | * | 8/2011 | ........ H01J 37/32192 |
| JP | 2016-42561 A |   | 3/2016 |              |

OTHER PUBLICATIONS

English Machine Translation of Matsumoto JP-2011150943-A retrieved from ESPACENT Mar. 7, 2022 (Year: 2022).*
(Continued)

*Primary Examiner* — Ram N Kackar
*Assistant Examiner* — Laureen Chan
(74) *Attorney, Agent, or Firm* — Edell, Shapiro & Finnan, LLC

(57) ABSTRACT

Described herein is a technique capable of cleaning a surrounding structure of a substrate placing surface in an apparatus. According to one aspect of the technique, there is provided a substrate processing apparatus including: a process chamber in which a substrate is processed; a substrate mounting plate provided with a substrate non-placing surface and a plurality of substrate placing surfaces; a rotator configured to rotate the substrate mounting plate; a plasma generator configured to generate plasma such that a plasma density over the substrate non-placing surface is higher than a plasma density over the plurality of the substrate placing surfaces; a process gas supplier configured to supply a process gas into the process chamber; a cleaning gas supplier configured to supply a cleaning gas into the process chamber; and a heater placed below the substrate mounting plate.

12 Claims, 12 Drawing Sheets

(51) Int. Cl.
*C23C 16/44* (2006.01)
*C23C 16/34* (2006.01)
*B08B 5/00* (2006.01)

(52) U.S. Cl.
CPC ........ *C23C 16/4405* (2013.01); *C23C 16/511* (2013.01); *H01J 37/32724* (2013.01); *H01J 37/32733* (2013.01); *H01J 2237/20214* (2013.01); *H01J 2237/327* (2013.01)

(56) References Cited

U.S. PATENT DOCUMENTS

| | | | | |
|---|---|---|---|---|
| 2014/0028190 | A1* | 1/2014 | Voronin | H05H 1/46 |
| | | | | 315/111.21 |
| 2014/0123895 | A1* | 5/2014 | Kato | H01J 37/32651 |
| | | | | 118/697 |
| 2015/0211124 | A1* | 7/2015 | Nozawa | C23C 16/45565 |
| | | | | 118/723 MW |
| 2015/0279627 | A1* | 10/2015 | Iwasaki | H01J 37/32238 |
| | | | | 118/723 ME |
| 2016/0053373 | A1 | 2/2016 | Inada et al. | |
| 2020/0299835 | A1* | 9/2020 | Ogawa | C23C 16/4405 |

OTHER PUBLICATIONS

Office Action in corresponding Taiwan Patent Application No. 109127199, dated Dec. 2, 2021, with English translation.

\* cited by examiner

SUBSTRATE PROCESSING APPARATUS

CROSS REFERENCE TO RELATED APPLICATIONS

This application claims foreign priority under 35 U.S.C. § 119(a)-(d) to Application No. JP 2020-125019 filed on Jul. 22, 2020, the entire contents of which are hereby incorporated by reference.

TECHNICAL FIELD

The present disclosure relates to a substrate processing apparatus.

BACKGROUND

In order to simultaneously improve a throughput and a process quality of a substrate processing, according to related arts, an apparatus configured to supply a gas while revolving a substrate around a specific axis may be used.

According to the apparatus described above, a plurality of substrates including the substrate are supported by a plurality of substrate placing surfaces provided on a substrate mounting plate of a plate shape, respectively. The plurality of the substrate placing surfaces are provided on the substrate mounting plate along the same circumference.

When the substrate is processed, the gas is supplied toward the substrate mounting plate while rotating the substrate mounting plate. Then, the gas is supplied to the substrate placed on a substrate placing surface among the plurality of the substrate placing surfaces, and as a result, a film is formed on the substrate.

When the gas is supplied toward the substrate mounting plate, the gas is supplied not only to the substrate but also to a surrounding structure of the substrate. For example, the term "surrounding structure of the substrate" refers to a portion of the substrate mounting plate between the plurality of the substrate placing surfaces.

Since the gas is also supplied to the surrounding structure, the film is also formed on the surrounding structure. However, the film formed on the surrounding structure may be peeled off to generate particles, and the particles may adhere to the substrate. Since the particles deteriorate a quality of the film formed on the substrate, it is preferable to prevent the film deposited on the surrounding structure from generating the particles.

SUMMARY

Described herein is a technique capable of cleaning a surrounding structure of a substrate placing surface in an apparatus.

According to one aspect of the technique of the present disclosure, there is provided a substrate processing apparatus including: a process chamber in which a substrate is processed; a substrate mounting plate provided with a substrate non-placing surface and a plurality of substrate placing surfaces; a rotator configured to rotate the substrate mounting plate; a plasma generator configured to generate plasma such that a plasma density over the substrate non-placing surface is higher than a plasma density over the plurality of the substrate placing surfaces; a process gas supplier configured to supply a process gas into the process chamber; a cleaning gas supplier configured to supply a cleaning gas into the process chamber; and a heater placed below the substrate mounting plate.

DETAILED DESCRIPTION

Hereinafter, one or more embodiments (also simply referred to as "embodiments") according to the technique of the present disclosure will be described with reference to the drawings.

First Embodiment

Figure 1:
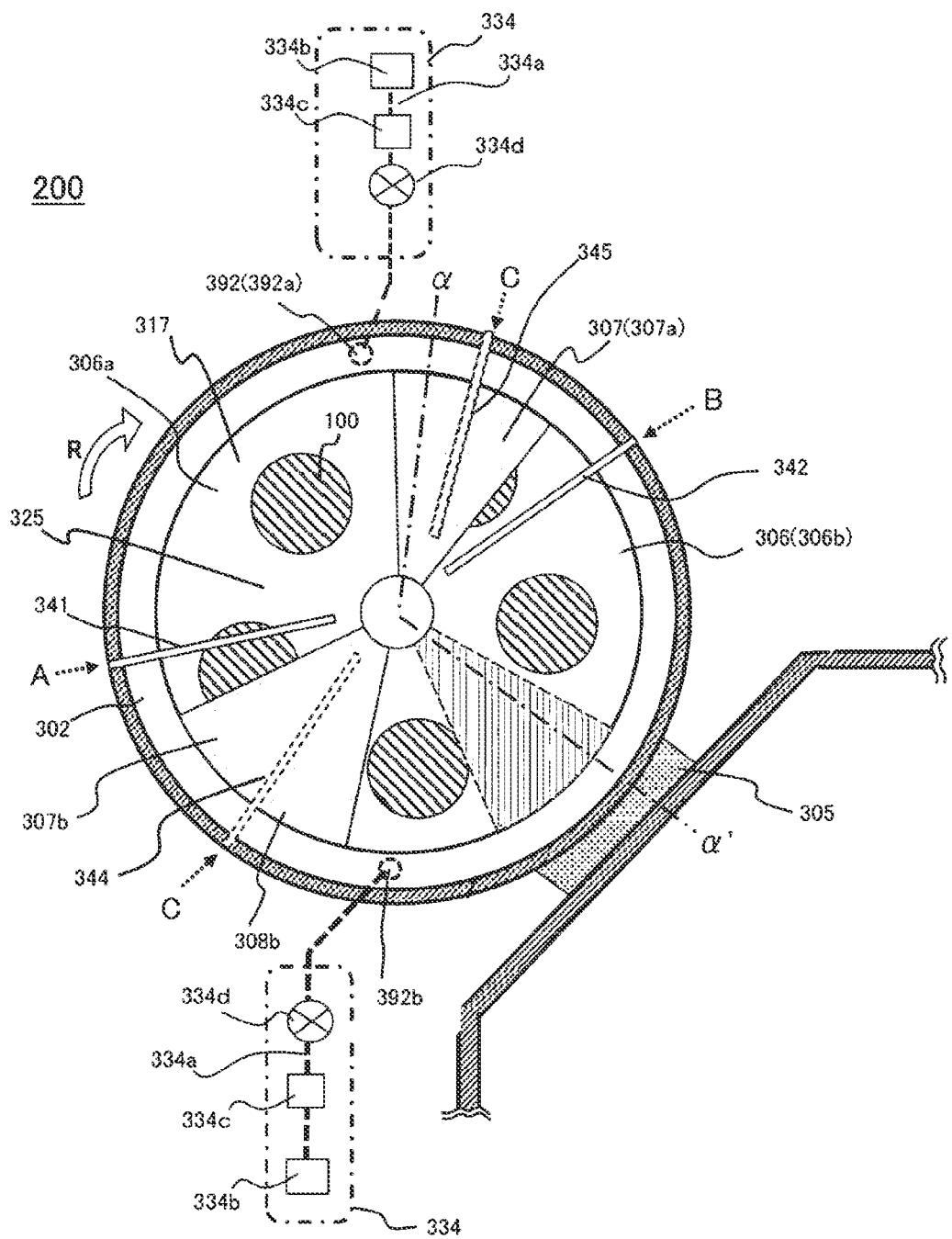
FIG. 1 schematically illustrates a horizontal cross-section of a substrate processing apparatus according to a first embodiment described herein.
Figure 2:
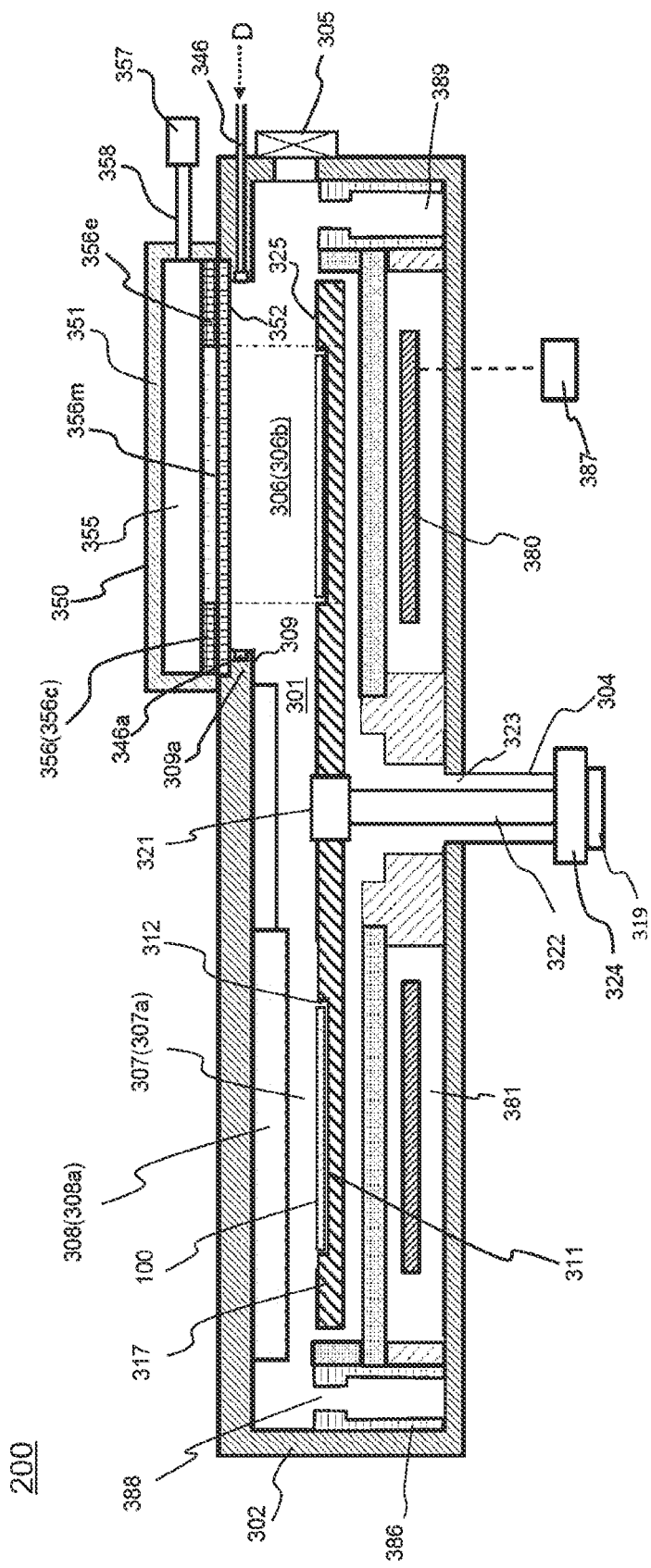
FIG. 2 schematically illustrates a vertical cross-section of the substrate processing apparatus according to the first embodiment described herein.
Figure 3:
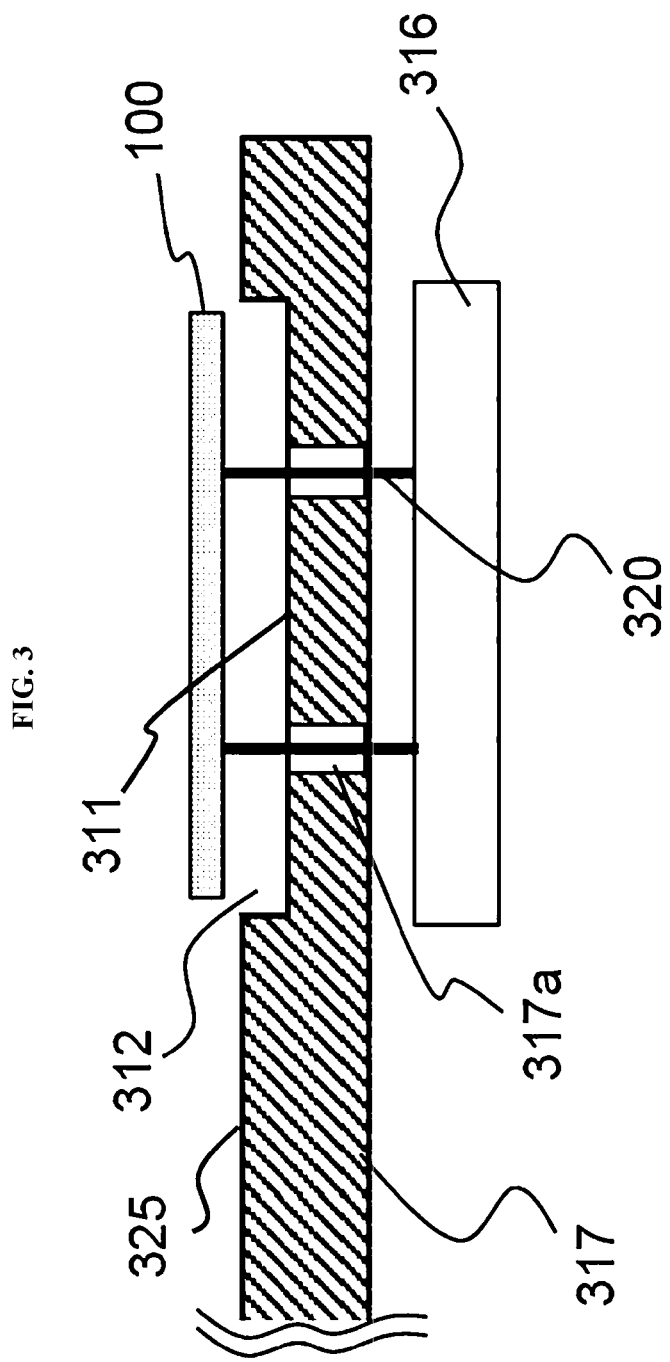
FIG. 3 schematically illustrates a substrate mounting plate and a substrate support according to the first embodiment described herein.

A first embodiment will be described with reference to the drawings. A configuration of a substrate processing apparatus 200 will be described mainly with reference to FIGS. 1, 2 and 3. FIG. 1 schematically illustrates the substrate processing apparatus 200 according to the first embodiment when viewed from above. That is, FIG. 1 schematically illustrates a horizontal cross-section of the substrate processing apparatus 200 according to the first embodiment. FIG. 2 schematically illustrates a vertical cross-section of the substrate processing apparatus 200 according to the first embodiment. That is, FIG. 2 schematically illustrates a vertical cross-section of a chamber 302 taken along the line α-α' of the substrate processing apparatus 200 according to the first embodiment shown in FIG. 1. The line α-α' is a line passing from α to α' through a center of the chamber 302. FIG. 3 schematically illustrates a substrate mounting plate 317 and a substrate support 316 according to the first embodiment described herein.

The configuration of the substrate processing apparatus 200 will be described in detail. The substrate processing apparatus 200 is controlled by a controller 400 described later.

As shown in FIGS. 1 and 2, the substrate processing apparatus 200 is constituted mainly by the chamber 302 which is a cylindrical sealed vessel (hermetic vessel). A process chamber 301 in which a plurality of substrates including a substrate 100 are processed is provided in the chamber 302. A gate valve 305 is connected to the chamber 302. The substrate 100 is loaded (transferred) into or unloaded (transferred) out of the chamber 302 through the gate valve 305.

The process chamber 301 includes a process region 306 to which a process gas such as a source gas and a reactive gas is supplied and a purge region 307 to which a purge gas is supplied. According to the first embodiment, the process region 306 and the purge region 307 are alternately arranged along a circumferential direction of the process chamber 301. For example, a first process region 306a, a first purge region 307a, a second process region 306b and a second purge region 307b are arranged along the circumferential direction sequentially in this order. As described later, for example, a first gas is supplied into the first process region 306a, a second gas is supplied into the second process region 306b, and an inert gas serving as the purge gas is supplied into the first purge region 307a and the second purge region 307b. As a result, a predetermined processing (substrate processing) is performed to the substrate 100 in accordance with the gases supplied into each region.

The purge region 307 is configured to spatially separate the first process region 306a and the second process region 306b. A ceiling 308 of the purge region 307 is disposed lower than a ceiling 309 of the process region 306. Specifically, a ceiling 308a is provided at the first purge region 307a, and a ceiling 308b is provided at the second purge region 307b. By lowering each of the ceilings such as the ceiling 308a and the ceiling 308b, it is possible to increase a pressure of a space of the purge region 307. By supplying the purge gas into the space of the purge region 307, it is possible to partition the adjacent process region 306 (that is, the first process region 306a and the second process region 306b). In addition, the purge gas removes excess gases on the substrate 100.

The substrate mounting plate 317 configured to be rotatable is provided at a center portion of the chamber 302. A rotating shaft of the substrate mounting plate 317 is provided at the center of the chamber 302. The substrate mounting plate 317 capable of heat transmission is configured to transmit the heat radiated from a heater 380 described later. The transmitted heat heats the substrate 100. For example, the substrate mounting plate 317 is made of a material such as quartz.

The substrate mounting plate 317 is configured such that the plurality of the substrates (for example, five substrates) including the substrate 100 can be arranged within the chamber 302 on the same plane and along the same circumference along a rotational direction "R".

A surface of the substrate mounting plate 317 is constituted by: a plurality of substrate placing surfaces (also simply referred to as "substrate placing surfaces") 311; and a surface (also referred to as a "substrate non-placing surface") 325 on which no substrate is placed. The plurality of the substrates including the substrate 100 are placed on the substrate placing surfaces 311, respectively. The substrate placing surfaces 311 are arranged at concentric positions from a center of the substrate mounting plate 317 at equal intervals (for example, 72° intervals). In FIG. 1, the illustration of the substrate placing surfaces 311 is omitted for convenience of description.

The substrate placing surfaces 311 are provided respectively at bottoms of a plurality of concave portions (also simply referred to as "concave portions") 312. Each of the concave portions 312 is of a circular shape when viewed from above and of a concave shape when viewed from a vertical cross-section thereof. It is preferable that a diameter of each of the concave portions 312 is slightly greater than a diameter of the substrate 100. For example, the substrate 100 may be placed on one of the substrate placing surfaces 311 by being placed on one of the concave portions 312.

Portions of the surface of the substrate mounting plate 317 other than the substrate placing surfaces 311 is referred to as the substrate non-placing surface 325. The substrate non-placing surface 325 is the portions of the surface of the substrate mounting plate 317 on which no substrate is placed (that is, the substrate 100 is not placed on the substrate non-placing surface 325). For example, the substrate non-placing surface 325 may include a surface region interposed between the concave portions 312, a surface region located at the center portion of the chamber 302 when viewed from the concave portions 312 and a surface region located at or near an outer peripheral portion of the chamber 302 when viewed from the concave portions 312.

Through-holes 317a penetrated by pins 320 described later are provided at each of the concave portions 312. The substrate support 316 shown in FIG. 3 is provided in the chamber 302 at a position below the substrate mounting plate 317 and facing the gate valve 305. The substrate support 316 includes the pins 320 configured to elevate or lower the substrate 100 and to support a back surface of the substrate 100 when the substrate 100 is loaded into or unloaded out of the process chamber 301. The pins 320 may be of an extendable configuration. For example, the pins 320 may be accommodated in a main body of the substrate support 316. When the substrate 100 is transferred, the pins 320 are extended to support the substrate 100. Thereafter, by moving front ends of the pins 320 downward, the substrate 100 is placed on one of the concave portions 312. The substrate support 316 may be embodied by any configuration as long as the pins 320 can be inserted into the through-holes 317a when the substrate 100 is placed.

The substrate mounting plate 317 is fixed to a core portion 321. The core portion 321 is provided at the center portion of the substrate mounting plate 317 and configured to fix the substrate mounting plate 317. A shaft 322 is disposed below the core portion 321. The shaft 322 supports the core portion 321.

A lower portion of the shaft 322 penetrates a hole 323 provided at a bottom of the chamber 302, and a bellows 304 capable of hermetically sealing the shaft 322 covers a periphery of the lower portion of the shaft 322. The bellows 304 is provided outside the chamber 302. A rotator (which is a rotating mechanism) 324 configured to rotate the substrate mounting plate 317 is provided at a lower end of the shaft 322. When the rotator is further configured to elevate and lower the substrate mounting plate 317, the rotator 324 may also be referred to as an elevator 319. The rotator 324 is configured to rotate the substrate mounting plate 317 according to an instruction from the controller 400 described later.

A heater structure 381 is disposed below the substrate mounting plate 317. A plurality of heaters (also simply referred to as "heaters") including the heater 380 serving as a heating device are embedded in the heater structure 381. The heaters including the heater 380 are configured to heat the plurality of the substrate including the substrate 100 placed on the substrate mounting plate 317, respectively. The heaters including the heater 380 are arranged along the same circumference in accordance with a shape of the chamber 302.

A heater controller (also referred to as a "heater temperature controller") 387 is connected to the heaters including the heater 380. The heater controller 387 is electrically connected to the controller 400 described later, and is configured to control the supply of the electric power to the heaters including the heater 380 according to an instruction from the controller 400 to perform a temperature control.

An exhaust structure 386 is disposed on an outer periphery of the substrate mounting plate 317. The exhaust structure 386 includes an exhaust groove 388 and an exhaust buffer space 389. Each of the exhaust groove 388 and the exhaust buffer space 389 is of a ring shape in accordance with the shape of the chamber 302.

Exhaust holes 392 are provided at a bottom of the exhaust structure 386. Gases such as the source gas and the reactive gas supplied into the chamber 302 are exhausted through the exhaust holes 392. Each of the gases describe above is exhausted through the exhaust holes 392 via the exhaust groove 388 and the exhaust buffer space 389.

Subsequently, a plasma generator 350 will be described. The plasma generator 350 is provided at a location facing the gate valve 305 in an upper region of the second process region 306b.

A vessel 351 constituting the plasma generator 350 is provided on the ceiling 309. A dielectric plate 352 is provided between the vessel 351 and the substrate mounting plate 317. A hole is provided in an upper wall of the chamber 302, and the dielectric plate 352 is configured to close the hole. The dielectric plate 352 is supported by a flange-shaped support 309a which is a part of the upper wall. The support 309a is of a circumferential shape.

A slot plate 356 is provided on the dielectric plate 352. A plurality of radiation holes (also simply referred to as "radiation holes") 339 described later are provided at the slot plate 356. The radiation holes 339 are configured such that a sum of opening areas varies for each of regions described later. Each of the regions will be described later in detail.

A space 355 is provided between an upper surface of the slot plate 356 and an inner wall of the vessel 351. A waveguide 358 is connected to the vessel 351. A microwave supplier (which is a microwave supply system) 357 is connected to the waveguide 358, and a microwave generated by the microwave supplier 357 is supplied to the space 355 via the waveguide 358.

A nozzle 346 is provided in the chamber 302 so as to supply a gas such as a cleaning gas below the dielectric plate 352. That is, the cleaning gas is supplied through the nozzle 346. A supply hole 346a of a circumferential shape arranged along a shape of the support 309a is provided at a front end (tip) of the nozzle 346.

The cleaning gas that has passed through the nozzle 346 is supplied through the supply hole 346a toward the lower portion of the dielectric plate 352.

Subsequently, the reasons why the plasma generator 350 is arranged at a position adjacent to the gate valve 305 will be described. As will be described later, the substrate 100 is loaded via the gate valve 305. When the substrate 100 is loaded, since the pins 320 are elevated or lowered, it is preferable that a ceiling of a region adjacent to the gate valve 305 is higher than ceilings of the other regions.

In addition, the plasma generator 350 generates a plasma of the cleaning gas. However, as described later, the energy of the plasma is preferably set so that the substrate placing surfaces 311 are not etched. Therefore, according to the first embodiment, by providing the plasma generator 350 in the region adjacent to the gate valve 305 and whose ceiling is higher than ceilings of the other region, the dielectric plate 352 and the substrate placing surfaces 311 are separated from each other by a certain distance, and the plasma of the cleaning gas is deactivated such that the substrate placing surfaces 311 are not etched by the plasma.

Figure 4:
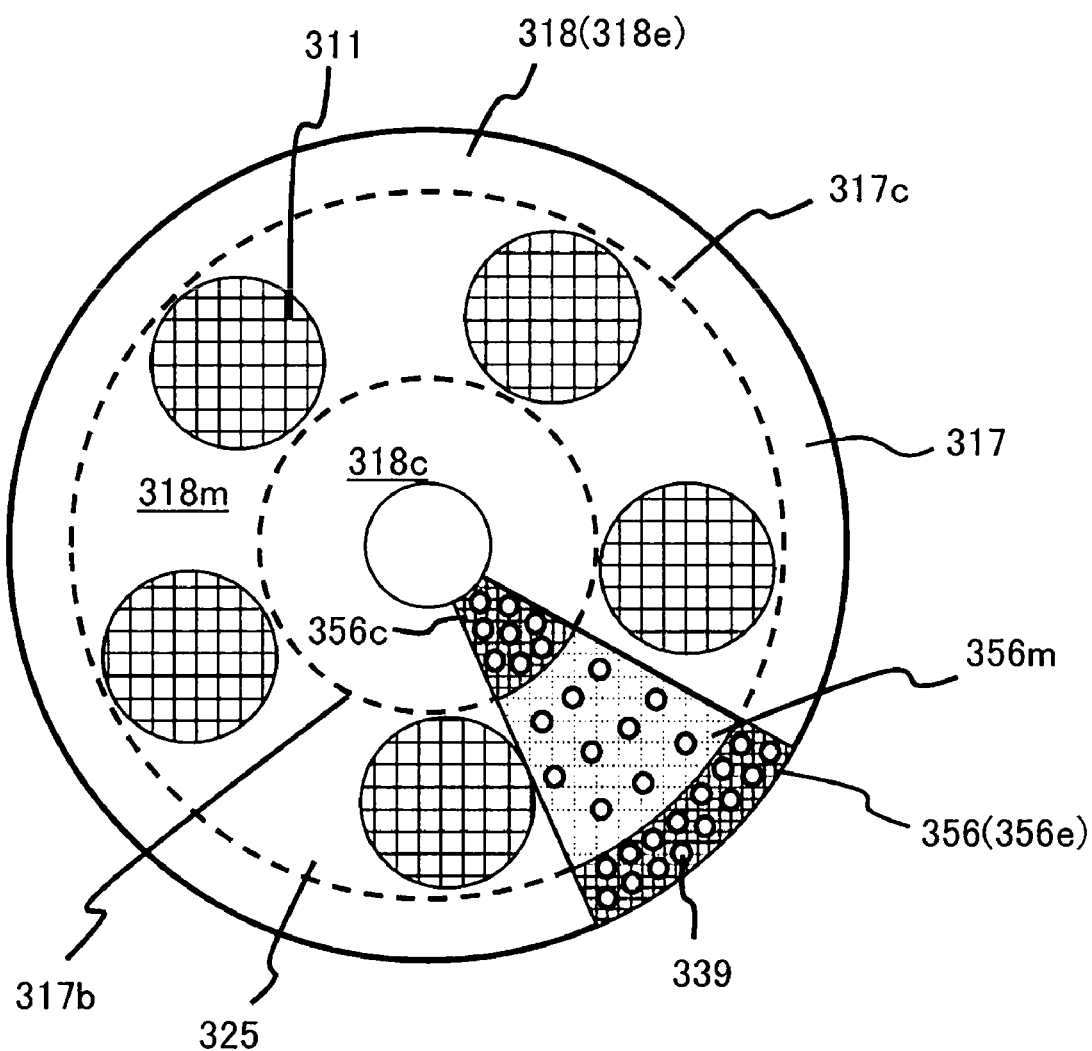
FIG. 4 schematically illustrates a relationship between the substrate mounting plate and a slot plate according to the first embodiment described herein.

Subsequently, the slot plate 356 will be described with reference to FIG. 4. FIG. 4 schematically illustrates a relationship between the substrate mounting plate 317 and the slot plate 356. A line 317b is a boundary line between a region 356c and a region 356m, which will be described later, and is a circumferentially extended line. A line 317c is a boundary line between a region 356e and the region 356m, which will be described later, and is a circumferentially extended line.

Reference numeral 318 indicates regions on the substrate mounting plate 317. A region of the substrate non-placing surface 325 extending from the line 317b to the center of the chamber 302 is referred to as a center region 318c, and a region extending from the line 317c to a vicinity of the outer periphery of the chamber 302 is referred to as an edge region 318e. In addition, a region interposed between the line 317b and the line 317c is referred to as a middle region 318m.

Regarding the regions described above, those regions are expressed as follows by referring to the substrate placing surfaces 311. The center region 318c is a region located at the center portion of the chamber 302 when viewed from above, and the edge region 318e is a region extending from outer boundaries of the substrate placing surfaces 311 to an edge of the substrate mounting plate 317. In addition, the middle region 318m is a region located closer to the outer periphery of the chamber 302 than the center region 318c is located, and closer to the center of the chamber 302 than the edge region 318e is located. That is, the middle region 318m is located in an outer periphery of the center region 318c.

The slot plate 356 includes, for example, three regions arranged from the center of the chamber 302 to the vicinity of the outer periphery of the chamber 302. That is, as shown in FIG. 4, the slot plate 356 includes the region 356c, the region 356m and the region 356e arranged from the center of the chamber 302 to the vicinity of the outer periphery of the chamber 302. A radial length of the region 356m is approximately equal to a diameter of each of the substrate placing surfaces 311.

The region 356c is arranged at the center portion of the chamber 302 when viewed from the region 356m. That is, the region 356c is located closer to the center of the chamber 302 than the substrate placing surfaces 311 are located in reference to the horizontal direction, and is disposed over a part of the center region 318c.

The region 356e is arranged close to the outer periphery of the chamber 302 when viewed from the region 356m. That is, the region 356e is located closer to the outer periphery of the chamber 302 than the substrate placing surfaces 311 are located in reference to the horizontal direction, and is disposed over a part of the edge region 318e.

The radiation holes 339 are provided in each region of the slot plate 356. An opening area per unit area of each of the radiation holes 339 in each region of the slot plate 356 is configured (or set) such that the opening area per unit area of the radiation holes 339 in the region 356*m* is less than the opening area per unit area of the radiation holes 339 in the region 356*c* or the region 356*e*. That is, the opening area per unit area of each of the radiation holes 339 is configured (or set) such that the opening area per unit area of the radiation holes 339 in the region 356*c* or the region 356*e* is greater than the opening area per unit area of the radiation holes 339 in the region 356*m*.

The microwave generated by the microwave supplier 357 is supplied to the dielectric plate 352 through the waveguide 358, the space 355 and the radiation holes 339, and further to the lower portion of the dielectric plate 352.

In parallel with the supply of the microwave, the cleaning gas is supplied toward the lower portion of the dielectric plate 352 through the nozzle 346. The cleaning gas is activated by the microwave and turned into the plasma (plasma state).

Since the amount of the plasma of the cleaning gas is proportional to an amount of the microwaves applied, and thus corresponds to the opening area of the radiation holes 339 in each region of the slot plate 356 describe above. Therefore, an amount of the plasma in the region 356*m* is less than an amount of the plasma in the region 356*c* or the region 356*e*.

Subsequently, a gas supplier (which is a gas supply system) will be described with reference to FIGS. 5A through 5D. A nozzle 341, a nozzle 342, a nozzle 344, a nozzle 345 and the nozzle 346 are provided at the chamber 302. "A" shown in FIG. 1 is connected to "A" shown in FIG. 5A. That is, the nozzle 341 is connected to a first gas supply pipe 241. "B" shown in FIG. 1 is connected to "B" shown in FIG. 5B. That is, the nozzle 342 is connected to a second gas supply pipe 251. "C" shown in FIG. 1 is connected to "C" shown in FIG. 5C. That is, each of the nozzle 344 and the nozzle 345 is connected to a purge gas supply pipe 261. "D" shown in FIG. 2 is connected to "D" shown in FIG. 5D. That is, the nozzle 346 is connected to a third gas supply pipe 271.

Figure 5A:
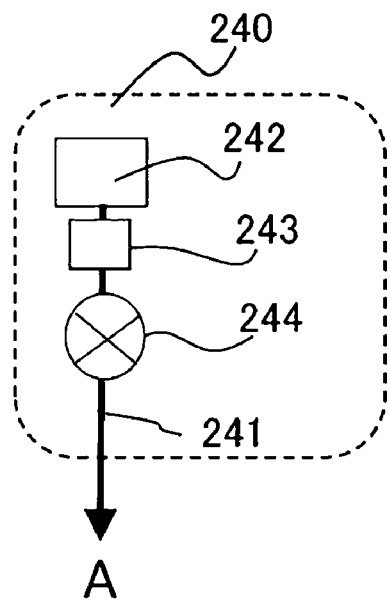
FIGS. 5A through 5D schematically illustrate a gas supplier according to the first embodiment described herein.

FIG. 5A schematically illustrates a first gas supplier (which is a first gas supply system) 240 serving as a part of the gas supplier. The first gas supplier 240 will be described in detail with reference to FIG. 5A. The first gas is mainly supplied through the first gas supply pipe 241.

A first gas supply source 242, a mass flow controller (MFC) 243 serving as a flow rate controller (which is a flow rate regulator) and a valve 244 serving as an opening/closing valve are sequentially provided at the first gas supply pipe 241 in order from an upstream side to a downstream side of the first gas supply pipe 241.

The first gas (which is a gas containing a first element) is supplied into the nozzle 341 via the first gas supply pipe 241 provided with the MFC 243 and the valve 244.

The first gas serves as the source gas (that is, one of process gases). According to the first embodiment, for example, the first element is silicon (Si). That is, the first gas is a silicon gas (also referred to as a "silicon (Si)-containing gas") containing silicon as a main component. Specifically, for example, dichlorosilane (DCS, $SiH_2Cl_2$) gas is used as the first gas.

The first gas supplier 240 is constituted mainly by the first gas supply pipe 241, the MFC 243, the valve 244 and the nozzle 341. The first gas supplier 240 may further include the first gas supply source 242.

Figure 5B:
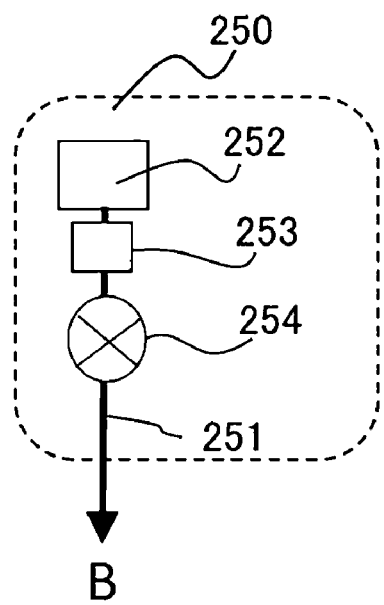

Subsequently, a second gas supplier (which is a second gas supply system) 250 serving as a part of the gas supplier will be described in detail with reference to FIG. 5B. A second gas supply source 252, a mass flow controller (MFC) 253 serving as a flow rate controller (which is a flow rate regulator) and a valve 254 are sequentially provided at the second gas supply pipe 251 in order from an upstream side to a downstream side of the second gas supply pipe 251.

The reactive gas reacting with the first gas is supplied into the nozzle 342 via the second gas supply pipe 251. The reactive gas is also referred to as the second gas. The second gas is one of the process gases. For example, the second gas is a nitrogen (N)-containing gas containing nitrogen as a main component. Specifically, for example, ammonia ($NH_3$) gas is used as the nitrogen-containing gas.

The second gas supplier 250 is constituted mainly by the second gas supply pipe 251, the MFC 253, the valve 254 and the nozzle 342. Since the reactive gas is supplied by the second gas supplier 250, the second gas supplier 250 may also be referred to as a reactive gas supplier (which is a reactive gas supply system). The second gas supplier 250 may further include the second gas supply source 252.

Figure 5C:
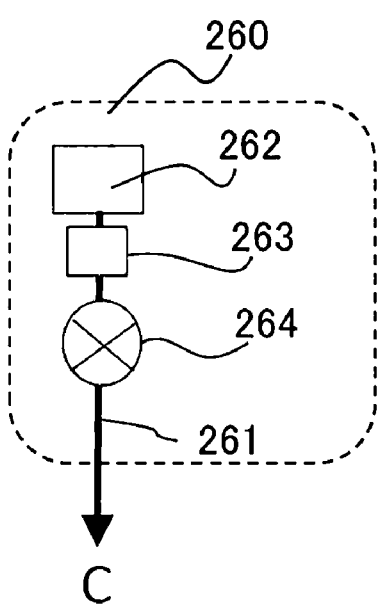

Subsequently, a purge gas supplier (which is a purge gas supply system) 260 serving as a part of the gas supplier will be described in detail with reference to FIG. 5C. A purge gas supply source 262, a mass flow controller (MFC) 263 serving as a flow rate controller (which is a flow rate regulator) and a valve 264 are sequentially provided at the purge gas supply pipe 261 in order from an upstream side to a downstream side of the purge gas supply pipe 261.

The purge gas is supplied into the nozzle 344 and the nozzle 345 via the purge gas supply pipe 261. The purge gas is a gas incapable of reacting with the first gas or the second gas, and one of gases used to purge an inner atmosphere of the process chamber 301. Specifically, for example, nitrogen ($N_2$) gas is used as the purge gas.

The purge gas supplier 260 is constituted mainly by the purge gas supply pipe 261, the MFC 263, the valve 264, the nozzle 344 and the nozzle 345. The purge gas supplier 260 may further include the purge gas supply source 262.

The first gas supplier 240 and the second gas supplier 250 may be collectively referred to as a process gas supplier (which is a process gas supply system). The process gas supplier may further include the purge gas supplier 260.

Figure 5D:
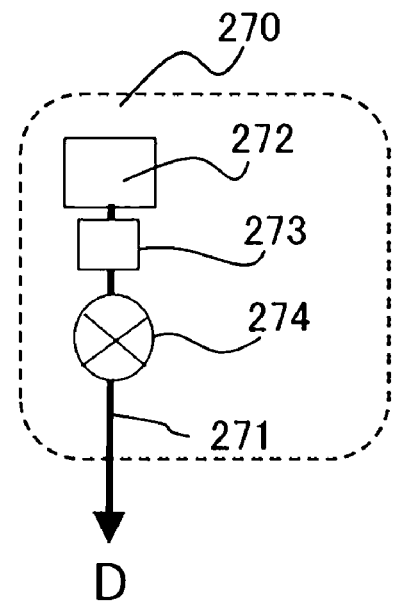

Subsequently, a third gas supplier (which is a third gas supply system) 270 serving as a part of the gas supplier will be described in detail with reference to FIG. 5D. A third gas supply source 272, a mass flow controller (MFC) 273 serving as a flow rate controller (which is a flow rate regulator) and a valve 274 are sequentially provided at the third gas supply pipe 271 in order from an upstream side to a downstream side of the third gas supply pipe 271.

The cleaning gas is supplied into the nozzle 346 via the third gas supply pipe 271 in order to remove a film formed on the substrate mounting plate 317. Specifically, for example, trifluoride ($NF_3$) gas or fluorine ($F_2$) gas is used as the cleaning gas.

The third gas supplier 270 is constituted mainly by the third gas supply pipe 271, the MFC 273, the valve 274 and the nozzle 346. Since the cleaning gas is supplied by the third gas supplier 270, the third gas supplier 270 may also be referred to as a cleaning gas supplier (which is a cleaning gas supply system). The third gas supplier 270 may further include the third gas supply source 272.

Subsequently, an exhaust system 334 will be described in detail. The exhaust holes 392 are provided at the bottom of the chamber 302. The exhaust holes 392 are provided at each of the process region 306. That is, an exhaust hole 392*a* is provided corresponding to the first process region 306a, and an exhaust hole 392b is provided corresponding to the second process region 306b.

An exhaust pipe 334a serving a part of the exhaust system 334 is provided so as to communicate with the exhaust hole 392a. A vacuum pump 334b serving as a vacuum exhauster is connected to the exhaust pipe 334a via a valve 334d serving as an opening/closing valve and an APC (Automatic Pressure Controller) valve 334c serving as a pressure controller (which is a pressure regulator). The vacuum pump 334b is configured to vacuum-exhaust the inner atmosphere of the process chamber 301 such that an inner pressure of the process chamber 301 reaches a predetermined pressure (vacuum degree).

The exhaust pipe 334a is provided so as to communicate with the exhaust hole 392b in addition to the exhaust hole 392a. The exhaust system 334 is constituted mainly by the exhaust pipe 334a, the valve 334d and the APC valve 334c. The exhaust system 334 may further include the vacuum pump 334b.

Figure 6:
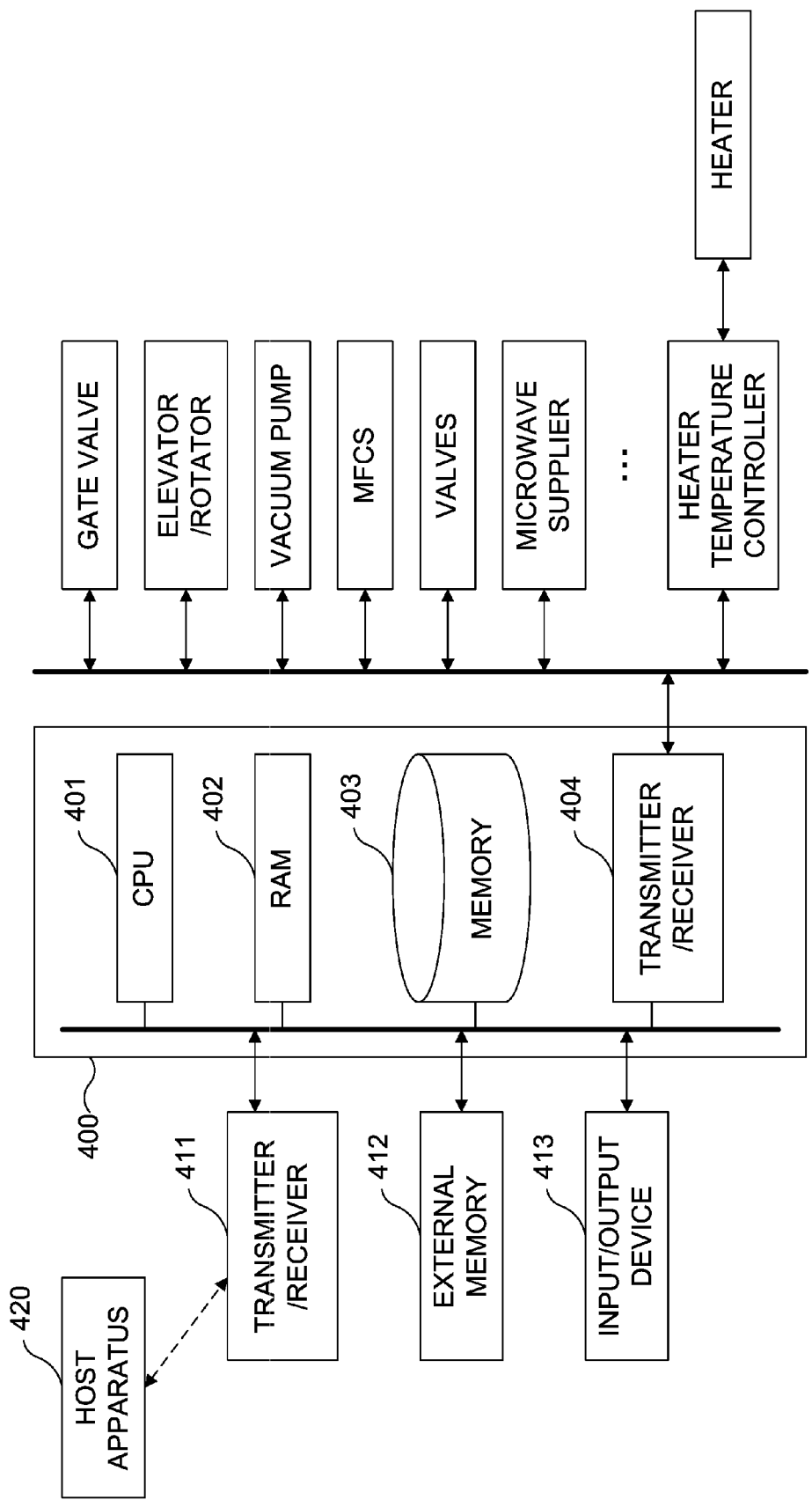
FIG. 6 is a block diagram schematically illustrating a configuration of a controller and related components of the substrate processing apparatus according to the first embodiment described herein.

Subsequently, the controller 400 will be described in detail with reference to FIG. 6. The substrate processing apparatus 200 includes the controller 400 configured to control the operations of the components of the substrate processing apparatus 200 such as the microwave supplier 357, the rotator 324, the elevator 319, the valves described above and the MFCs described above. The controller 400 includes at least a CPU (Central Processing Unit) 401 serving as an arithmetic unit, a RAM (Random Access Memory) 402 serving as a temporary memory, a memory 403 and a transmitter/receiver 404. The controller 400 is connected to the components of the substrate processing apparatus 200 via the transmitter/receiver 404, calls a program or a recipe from the memory 403 in accordance with an instruction from a host controller or a user, and controls the operations of the components of the substrate processing apparatus 200 according to the contents of the instruction. The controller 400 may be embodied by a dedicated computer or by a general-purpose computer. According to the first embodiment, for example, the controller 400 may be embodied by preparing an external memory 412 storing the program and by installing the program onto the general-purpose computer using the external memory 412. For example, the external memory 412 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. The means for providing the program to the computer is not limited to the external memory 412. For example, the program may be supplied to the computer (general-purpose computer) using communication means such as the Internet and a dedicated line. The program may be provided to the computer without using the external memory 412 by receiving the information (that is, the program) from a host apparatus 420 via a transmitter/receiver 411. In addition, a user can input an instruction to the controller 400 using an input/output device 413 such as a keyboard and a touch panel.

The memory 403 or the external memory 412 may be embodied by a non-transitory computer readable recording medium. Hereafter, the memory 403 and the external memory 412 may be collectively referred to as the recording medium. In the present specification, the term "recording medium" may refer to only the memory 403, may refer to only the external memory 412 or may refer to both of the memory 403 and the external memory 412.

Substrate Processing

Figure 7:
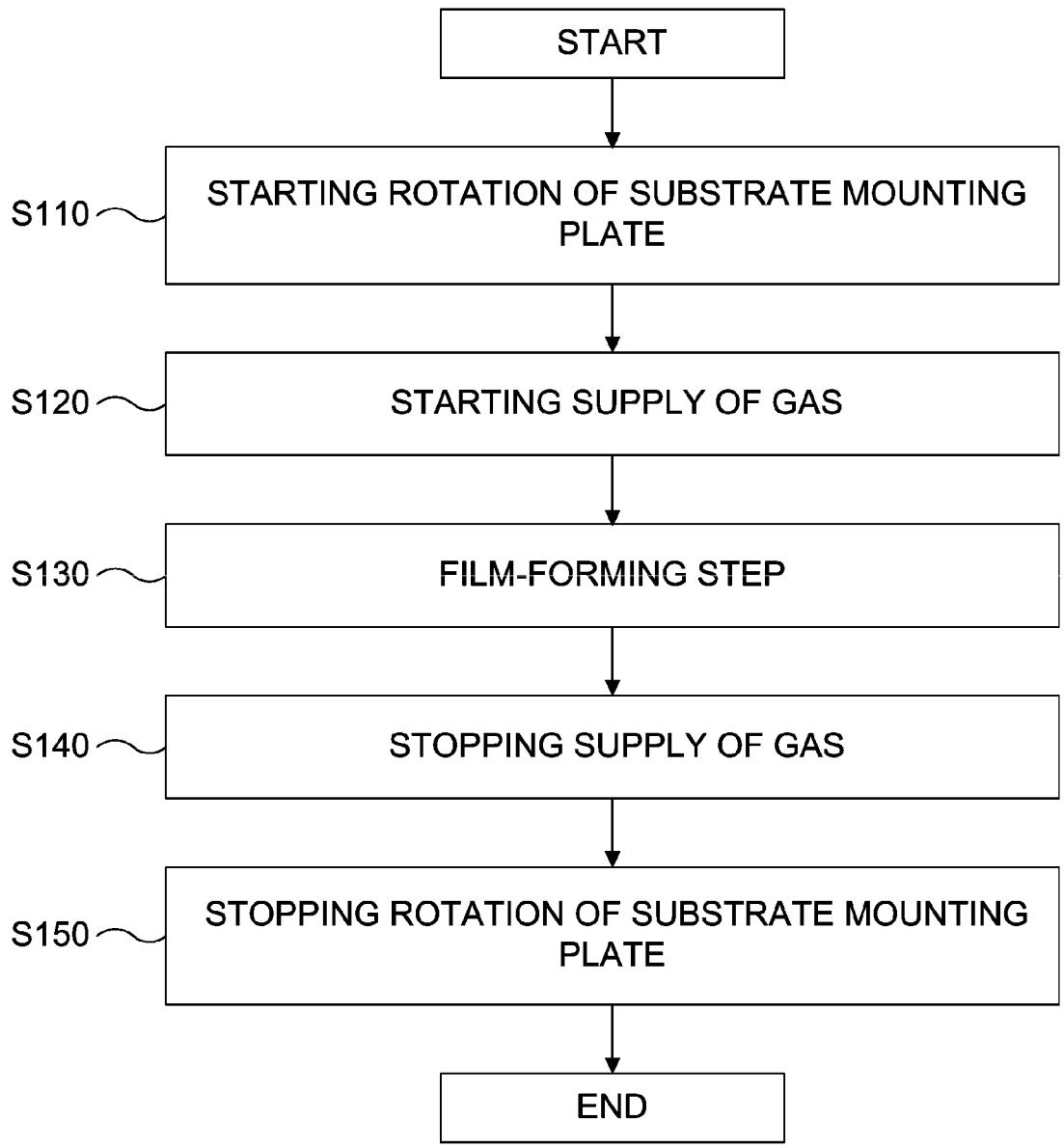
FIG. 7 is a flow chart schematically illustrating a substrate processing according to the first embodiment described herein.

Subsequently, the substrate processing according to the first embodiment will be described with reference to FIG. 7. FIG. 7 is a flow chart schematically illustrating the substrate processing according to the first embodiment described herein. In the following description, the operations of the components of the substrate processing apparatus 200 are controlled by the controller 400.

The substrate processing according to the first embodiment will be described by way of an example in which a silicon nitride (SiN) film serving as the film is formed on the substrate 100 by using the silicon-containing gas as the first gas and the ammonia gas as the second gas.

A substrate loading and placing step will be described. The illustration of the substrate loading and placing step is omitted in FIG. 7. The substrate mounting plate 317 is rotated to move one of the concave portions 312 to a position adjacent to the gate valve 305. Then, the pins 320 are elevated such that the pins 320 pass through the through-holes 317a of the substrate mounting plate 317. Subsequently, the gate valve 305 is opened to communicate the chamber 302 with a vacuum transfer chamber (not shown). The, the substrate 100 is placed on the pins 320 from the vacuum transfer chamber by using a wafer transfer device (not shown). After the substrate 100 is placed on the pins 320, by lowering the pins 320, the substrate 100 is placed on one of the substrate placing surfaces 311 corresponding to the one of the concave portions 312.

After the substrate 100 is placed on the one of the substrate placing surfaces 311, the substrate mounting plate 317 is rotated until another of the substrate placing surfaces 311, where the substrate 100 is not placed, faces the gate valve 305. Thereafter, one of the substrates is placed on the above-mentioned another one of the substrate placing surfaces 311. An operation described above is repeated until the plurality of the substrates including the substrate 100 are completely placed on the plurality of the substrate placing surfaces 311.

When the plurality of the substrates including the substrate 100 are placed on the substrate mounting plate 317, the electric power is supplied to the heaters including the heater 380 in advance such that a temperature (surface temperature) of each of the plurality of the substrates including substrate 100 is adjusted to a predetermined temperature. For example, the predetermined temperature of the substrate 100 according to the first embodiment may range from 400° C. to 500° C. The heat radiated from the heater 380 is applied to the back surface of the substrate 100 via the substrate mounting plate 317. The electric power may be continuously supplied to the heaters including the heater 380 from the substrate loading and placing step until at least a substrate unloading step described later is completed.

A step S110 of starting the rotation of the substrate mounting plate 317 will be described. After the plurality of the substrates including the substrate 100 are completely placed on the concave portions 312, the controller 400 controls a rotator 324 to rotate the substrate mounting plate 317 in the "R" direction shown in FIG. 1. By rotating the substrate mounting plate 317, the substrate 100 is moved to the first process region 306a, the first purge region 307a, the second process region 306b and the second purge region 307b sequentially in this order.

A step S120 of starting the supply of the gas will be described. When the substrate 100 is heated to a desired temperature and the substrate mounting plate 317 reaches a desired rotation speed, the valve 244 is opened to start the supply of the silicon-containing gas into the first process region 306a. In parallel with the supply of the silicon-containing gas, the valve 254 is opened to supply the NH$_3$ gas into the second process region 306b.

In the step S120, a flow rate of the silicon-containing gas is adjusted by the MFC 243 to a predetermined flow rate. For example, the predetermined flow rate of the silicon-containing gas in the step S120 may range from 50 sccm to 500 sccm.

In the step S120, a flow rate of the NH$_3$ gas is adjusted by the MFC 253 to a predetermined flow rate. For example, the predetermined flow rate of the NH$_3$ gas in the step S120 may range from 100 sccm to 5,000 sccm.

In addition, after the substrate loading and placing step, the process chamber 301 is exhausted by the exhaust system 334 and the N$_2$ gas serving as the purge gas is supplied into the first purge region 307a and the second purge region 307b through the purge gas supplier 260.

A film-forming step S130 will be described. In the film-forming step S130, a silicon-containing layer is formed on the substrate 100 in the first process region 306a. After the substrate 100 is rotated to the second process region 306b, by reacting the silicon-containing layer with the NH$_3$ gas in the second process region 306b, a silicon nitride (SiN) film is formed on the substrate 100. The substrate mounting plate 317 is rotated a predetermined number of times so that the SiN film of a desired thickness is obtained. In the film-forming step S130, the silicon-containing gas and the NH$_3$ gas are also supplied to the substrate non-placing surface 325. As a result, the film (that is, the SiN film) is also formed on the substrate non-placing surface 325.

A step S140 of stopping the supply of the gas will be described. After the substrate mounting plate 317 is rotated the predetermined number of times, the valve 244 is closed to stop the supply of the silicon-containing gas to the first process region 306a and the valve 254 is closed to stop the supply of the NH$_3$ gas to the second process region 306b.

A step S150 of stopping the rotation of the substrate mounting plate 317 will be described. After the supply of the silicon-containing gas and the supply of the NH$_3$ gas are stopped according to the step S140, the rotation of the substrate mounting plate 317 is stopped in the step S150.

The substrate unloading step will be described. The illustration of the substrate unloading step is omitted in FIG. 7. The substrate mounting plate 317 is rotated to move the substrate 100 to the position facing the gate valve 305. Thereafter, the substrate 100 is transferred (unloaded) out of the chamber 302 in the order reverse to that of the substrate loading and placing step. An operation described above is repeated until the plurality of the substrates are completely unloaded out of the chamber 302.

Subsequently, a cleaning step will be described. The cleaning step is a part of the substrate processing. The cleaning step is performed without loading the plurality of the substrates including the substrate 100 into the substrate processing apparatus 200. That is, the cleaning step is performed when the plurality of the substrates are not present in the substrate processing apparatus 200. Therefore, the plurality of the substrates including the substrate 100 are not placed on the substrate placing surfaces 311.

When the film formed on a surface of the substrate non-placing surface 325 in the film-forming step S130 peeled off to generate particles, the substrate 100 may be adversely affected. For example, when a peeled film adheres to the substrate 100, a resistance of a device such as a semiconductor device formed on the substrate 100 may vary and the quality of the device may deteriorate.

Therefore, according to the cleaning step, by cleaning the surface of the substrate non-placing surface 325, it is possible to prevent the film formed on the surface of the substrate non-placing surface 325 from being peeled off. In the cleaning step, a cleaning process is performed by using the cleaning gas in a plasma state as described later.

Hereinafter, a comparative example will be described. According to the comparative example, the substrate non-placing surface 325 and the substrate placing surfaces 311 are cleaned during the cleaning process. As described above, the cleaning process is performed without the substrate 100, that is, with the substrate placing surfaces 311 exposed. Therefore, the cleaning gas in the plasma state directly irradiates the substrate placing surfaces 311.

The cleaning gas in the plasma state etches the substrate placing surfaces 311. A thermal refractive index for the heat radiated from the heater 380 may change (vary) when the cleaning gas in the plasma state etches the substrate placing surfaces 311. When the refractive index changes, the heat radiated to the entire back surface of the substrate 100 may change as compared with the heat before etching. For example, an abnormality occurs where the refractive index becomes different. For example, the heat is less likely to be transmitted or reflected at the portion of a different refractive index, as compared with the heat before etching. As a result, the substrate 100 may not be uniformly heated.

Therefore, according to the first embodiment, the substrate non-placing surface 325 is cleaned while suppressing the etching of the substrate placing surfaces 311. The cleaning step according to the first embodiment will be described below in detail.

When the substrate 100 is unloaded out of the substrate processing apparatus 200, the gate valve 305 is closed. Then, the microwave supplier 357 generates the microwave. In parallel with the supply of the microwave, the cleaning gas is supplied toward the lower portion of the dielectric plate 352 through the nozzle 346. The cleaning gas is activated by the microwave and turned into the plasma (plasma state).

As described above, the opening area per unit area of the radiation holes 339 in the region 356m is less than the opening area per unit area of the radiation holes 339 in the region 356c. Therefore, as for a plasma density of each region, the plasma of the cleaning gas is generated such that the plasma density of the region 356c is higher than the plasma density of the region 356m. In addition, the opening area per unit area of the radiation holes 339 in the region 356m is less than the opening area per unit area of the radiation holes 339 in the region 356e. Therefore, as for the plasma density of each region, the plasma of the cleaning gas is generated such that the plasma density of the region 356e is higher than the plasma density of the region 356m.

Subsequently, the reasons why the plasma of the cleaning gas is generated in accordance with a density relationship described above will be described. As described above, the substrate 100 is placed on one of the substrate placing surfaces 311 during the film-forming step S130. Therefore, the substrate placing surfaces 311 are hardly exposed to the gas such as the silicon-containing gas and the NH$_3$ gas. As a result, the film is hardly formed on the substrate placing surfaces 311.

On the other hand, the substrate non-placing surface 325 is exposed to the gas such as the silicon-containing gas and the NH$_3$ gas during the film-forming step S130. As a result, the film is formed on the substrate non-placing surface 325. That is, the film formed on the substrate non-placing surface 325 is thicker than the film formed on the substrate placing surfaces 311.

When the plasma of the same density is generated in the regions 356c, 356m and 356e in such a state (that is, the film formed on the substrate non-placing surface 325 is thicker than the film formed on the substrate placing surfaces 311), the following problems may occur. The first problem is that the plasma of the same density etches the substrate placing surfaces 311. For example, when a strong plasma of the cleaning gas is used to remove the film on the substrate non-placing surface 325 near the center of the chamber 302 in a short time, the substrate placing surfaces 311 passing below the region 356m is also exposed to the strong plasma. Therefore, the substrate placing surfaces 311 may be etched by the strong plasma. When the substrate placing surfaces 311 is etched, the heat transmission rate on the substrate placing surfaces 311 varies, and the substrate placing surfaces 311 cannot be uniformly heated.

The second problem is that, when the strength of the plasma is set such that the substrate placing surfaces 311 are not etched, it takes time to remove the film located near the center and the outer periphery of the substrate non-placing surface 325. As a result, a downtime becomes longer.

In order to address the problems described above, the plasma density on the middle region 318m is set lower than that the plasma density on other regions. In order to realize it, the opening area per unit area of the radiation holes 339 in the region 356m is set less than the opening area per unit area of the radiation holes 339 in the region 356c, and the opening area per unit area of the radiation holes 339 in the region 356m is set less than the opening area per unit area of the radiation holes 339 in the region 356e.

Thereby, it is possible to clean the surface of the substrate non-placing surface 325 in a short time without etching the substrate placing surfaces 311.

When the plasma is generated, the rotation of the substrate mounting plate 317 is started. The substrate mounting plate 317 is continuously rotated while the substrate placing surfaces 311 pass below the region 356m. While the substrate mounting plate 317 is rotated, the film on the substrate non-placing surface 325 below the regions 356c and 356e is cleaned (removed). Although the plasma of the cleaning gas is exposed on the substrate placing surfaces 311, the plasma does not stay on the substrate placing surfaces 311 because the substrate mounting plate 317 is rotated.

When the substrate placing surfaces 311 are not located below the region 356m, that is, when the substrate non-placing surface 325 between the substrate placing surfaces 311 is below the region 356m, the rotation of the substrate mounting plate 317 is stopped. By stopping the rotation of the substrate mounting plate 317, the substrate non-placing surface 325 between the substrate placing surfaces 311 is cleaned. Since the cleaning gas stays on the substrate non-placing surface 325, the film on the substrate non-placing surface 325 is cleaned.

As described above, by rotating and stopping the substrate mounting plate 317 repeatedly, it is possible to clean the entirety of substrate non-placing surface 325 without etching the substrate placing surfaces 311. Therefore, it is possible to uniformly heat the substrate 100.

Second Embodiment

Figure 8:
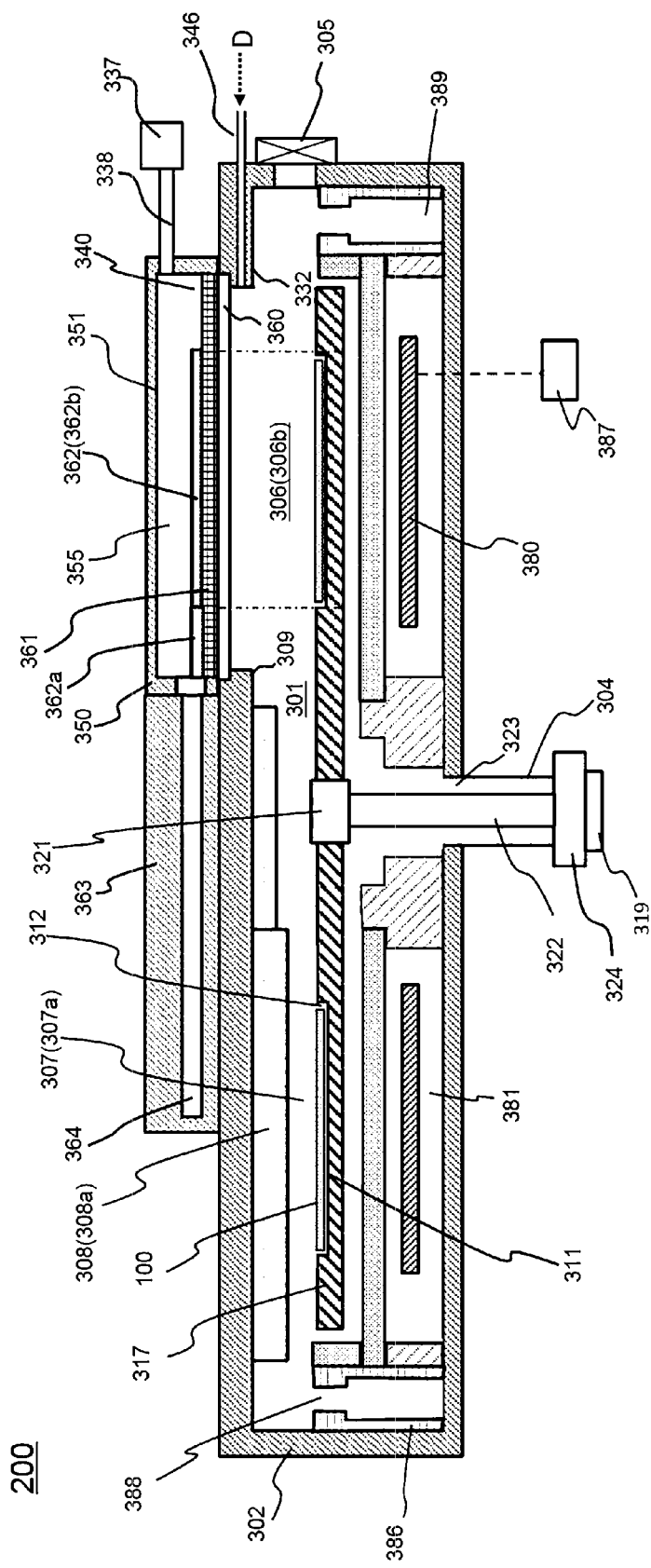
FIG. 8 schematically illustrates a vertical cross-section of a substrate processing apparatus according to a second embodiment described herein.
Figure 9:
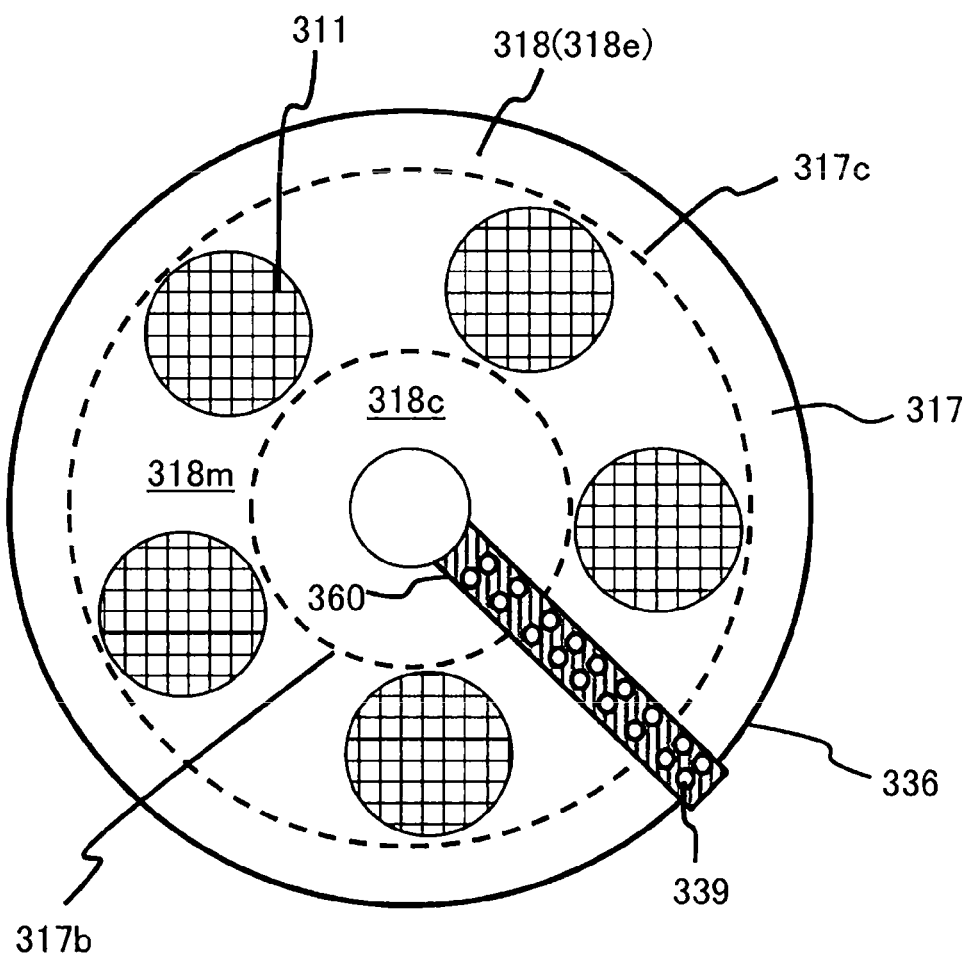
FIG. 9 schematically illustrates a relationship between the substrate mounting plate and a slot plate according to the second embodiment described herein.
Figure 10:
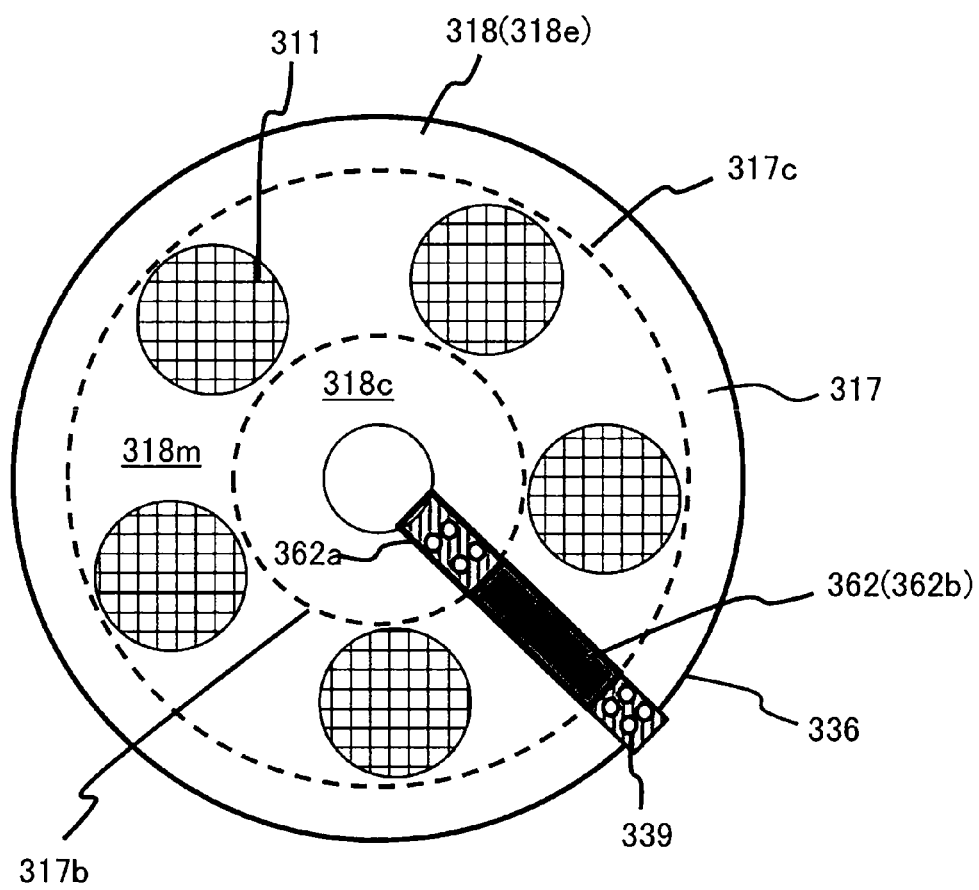
FIG. 10 schematically illustrates relationships among the substrate mounting plate, the slot plate and a moving plate according to the second embodiment described herein.

A second embodiment will be described with reference to FIGS. 8 through 10. FIG. 8, which corresponds to FIG. 2, schematically illustrates a vertical cross-section of the substrate processing apparatus 200 according to the second embodiment described herein when viewed from a side thereof. FIG. 9 schematically illustrates a relationship between the substrate mounting plate 317 and a slot plate 361 according to the second embodiment described herein. FIG. 10 schematically illustrates relationships among the substrate mounting plate 317, the slot plate 361 and a moving plate 362 according to the second embodiment described herein.

The second embodiment is different from the first embodiment in that shapes of a dielectric plate 360 and the slot plate 361 are different from those of the first embodiment, and the moving plate 362 capable of adjusting the opening area per unit area of each of the radiation holes 339 in each region is provided on the slot plate 361. In addition, the specific process in the cleaning step is different. The other configurations according to the second embodiment are the same as those according to the first embodiment. The differences between the second embodiment and the first embodiment will be mainly described below.

The slot plate 361 is provided on the dielectric plate 360. As shown in FIG. 9, the slot plate 361 is of a rectangular shape, and is arranged from the center of the chamber 302 to the vicinity of the outer periphery of the chamber 302. The radiation holes 339 are uniformly (evenly) provided at the slot plate 361. The dielectric plate 360 is of a rectangular shape similar to the slot plate 361. The dielectric plate 360 and the slot plate 361 are configured to overlap with each other when viewed from above.

The moving plate 362 is arranged on the slot plate 361. The moving plate 362 is of a rectangular shape, and is configured to be movable from the center of the chamber 302 to the vicinity of the outer periphery of the chamber 302. A vessel 363 serving as a container configured to accommodate the moving plate 362 is provided next to the vessel 351. A space 364 is provided in the vessel 363, and the moving plate 362 is configured to reciprocate between the vessel 363 and the vessel 351 by a mover (which is a moving mechanism, not shown), specifically, between the space 364 and the space on the slot plate 361.

As shown in FIG. 10, the moving plate 362 includes a first portion 362a provided at the center portion of the chamber 302 and a second portion 362b located closer to the outer periphery of the chamber 302 than the first portion 362a is located. A length of the second portion 362b in a radial direction of the chamber 302 is the same as the diameter of each of the substrate placing surfaces 311. A length of the first portion 362a in the radial direction of the chamber 302 is set so as to cover the center region 318c.

The first portion 362a is a frame in which holes are provided in a center thereof, and is configured to expose the radiation holes 339 when viewed from the space 355 when the slot plate 361 and the moving plate 362 overlap with each other. For example, the second portion 362b is a plate free of hole, and is configured to close the radiation holes 339 when viewed from the space 355 when the slot plate 361 and the moving plate 362 overlap with each other.

Since the first portion 362a is configured to expose the radiation holes 339, the first portion 362a may also be referred to as an "exposed portion". Moreover, since the holes described above are provided in the first portion 362a, the first portion 362a may also be referred to as a "perforated portion". Since the second portion 362b is configured to close the radiation holes 339, and the second portion 362b may also be referred to as a "closed portion". Moreover, since no hole is provided in the second portion 362b, the second portion 362b may also be referred to as a "hole-free region".

Subsequently, a cleaning step according to the second embodiment will be described. Similar to the first embodiment, when performing the cleaning step, the plasma of the cleaning gas is generated. When the plasma is generated, the rotation of the substrate mounting plate 317 is started.

When the substrate placing surfaces 311 pass below the plasma generator 350 by rotating the substrate mounting plate 317, the moving plate 362 is arranged on the slot plate 361. Specifically, the second portion 362b is moved so as to close the radiation holes 339 on the substrate placing surfaces 311. When the second portion 362b is moved, the first portion 362a is also moved. However, since the holes are provided in the first portion 362a, the radiation holes 339 on the center region 318c is not blocked. By moving the moving plate 362 as described above, the radiation holes 339 in the middle region 318m are blocked and the radiation holes 339 in the center region 318c and the edge region 318e are opened, as shown in FIG. 10. Therefore, the plasma is not generated over the substrate placing surfaces 311 and the plasma is generated in the center region 318c and the edge region 318e over the substrate non-placing surface 325. Thereby, the center region 318c and the edge region 318e are cleaned.

When cleaning a region between the adjacent substrate placing surfaces 311 of the substrate non-placing surface 325, the moving plate 362 is retracted to the vessel 363 while the region between the adjacent substrate placing surfaces 311 passes below the plasma generator 350. By retracting the moving plate 362, the radiation holes 339 in each of the center region 318c, the middle region 318m and the edge region 318e are opened. Therefore, it is possible to supply the plasma to the center region 318c, the edge region 318e and the region between the adjacent substrate placing surfaces 311 of the substrate non-placing surface 325. Thereby, a central region (that is, the center region 318c), an outer peripheral region (that is, the edge region 318e) and the region between the substrate placing surfaces 311 are cleaned.

As described above, by moving the moving plate 362 in accordance with the movement of the substrate placing surfaces 311, it is possible to clean the entire substrate non-placing surface 325 without etching the substrate placing surfaces 311. Therefore, it is possible to uniformly heat the substrate 100.

According to the second embodiment, the moving plate 362 is movable from a center of the process chamber 301 to a vicinity of an outer periphery of the process chamber 301. However, the second embodiment is not limited thereto. For example, according to the second embodiment, any structure may be used as long as it covers the radiation holes 339 on the substrate placing surfaces 311. For example, the moving plate 362 may be operated from the vicinity of the outer periphery of the process chamber 301 to the center of the process chamber 301. In this case, the first portion 362a is provided close to the outer periphery of the process chamber 301. In addition, the vessel 363 is provided near the outer periphery of the vessel 351.

Third Embodiment

Figure 11:
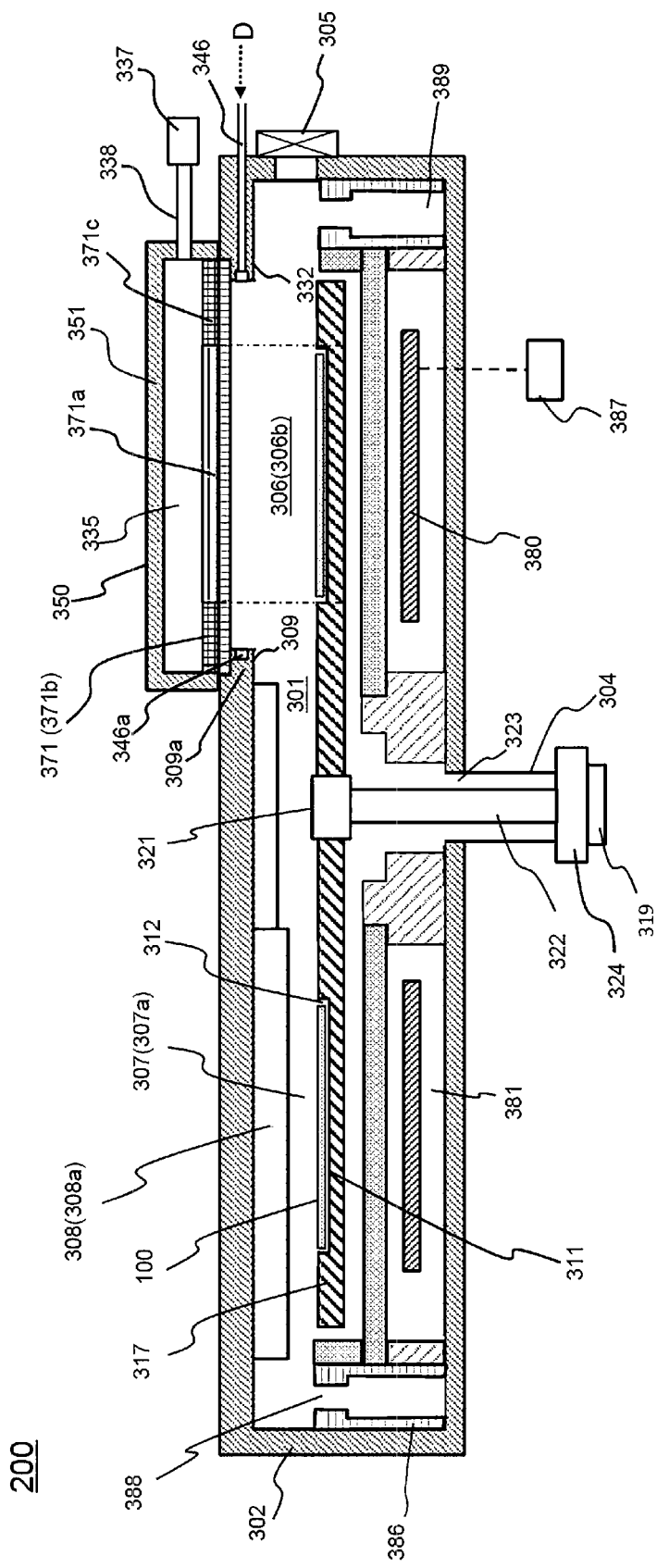
FIG. 11 schematically illustrates a vertical cross-section of a substrate processing apparatus according to a third embodiment described herein.
Figure 12:
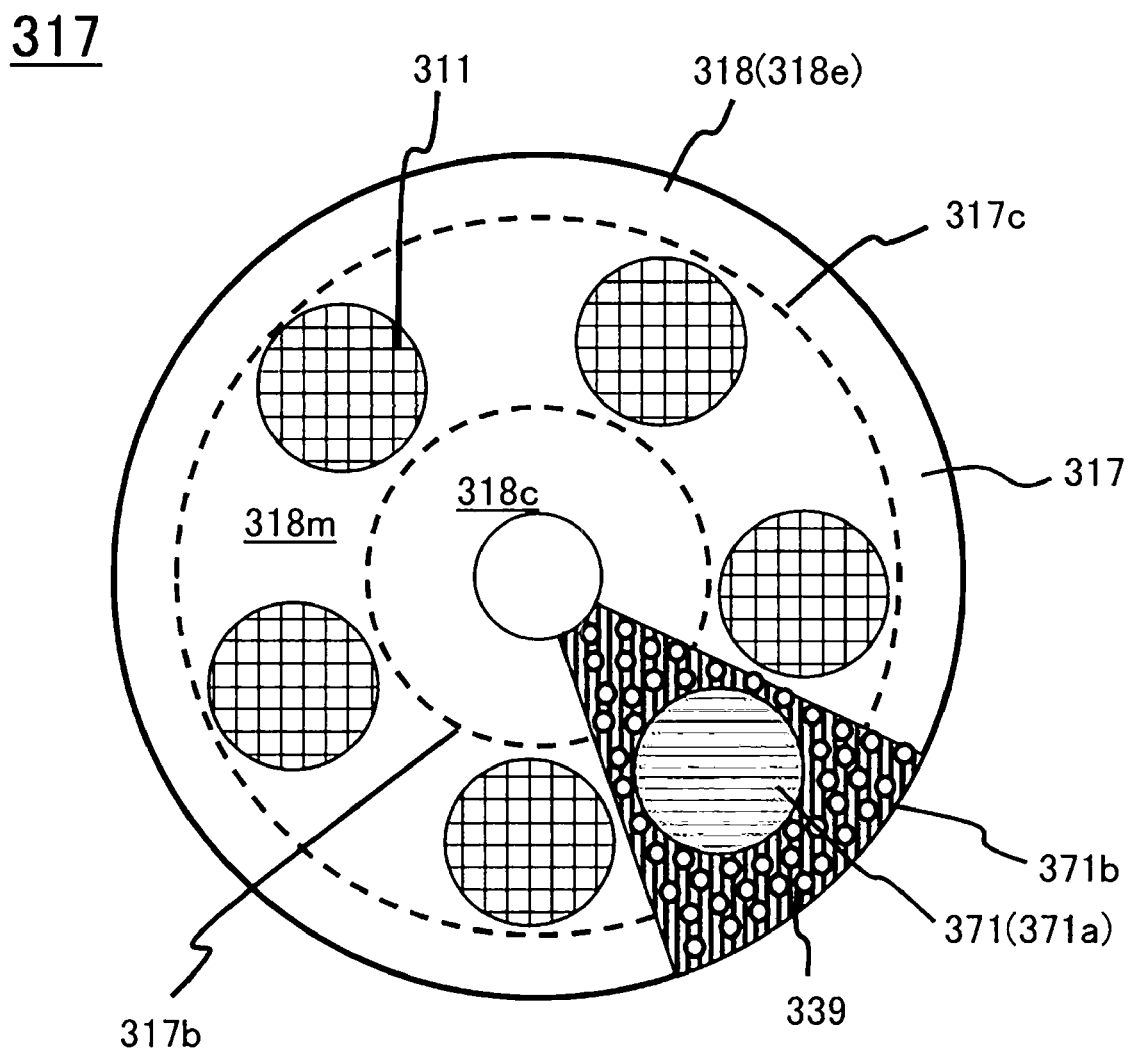
FIG. 12 schematically illustrates a relationship between the substrate mounting plate and a slot plate according to the third embodiment described herein.

Subsequently, a third embodiment will be described with reference to FIGS. 11 and 12. FIG. 11, which corresponds to FIG. 2, schematically illustrates a vertical cross-section of the substrate processing apparatus 200 according to the third embodiment described herein when viewed from a side thereof. FIG. 12 schematically illustrates a relationship between the substrate mounting plate 317 and a slot plate 371 according to the third embodiment described herein.

The third embodiment is different from the first embodiment in that a shape of the slot plate 371 is different from that of the slot plate 356 according to the first embodiment. The differences between the third embodiment and the first embodiment will be mainly described below.

The slot plate 371 is arranged from the center of the chamber 302 to the vicinity of the outer periphery of the chamber 302. A first region 371a whose size is the same as one of the substrate placing surfaces 311 is provided on the slot plate 371. The radiation holes 339 are provided in a second region 371b of the slot plate 371 other than the first region 371a. No radiation hole is provided in the first region 371a.

Since no hole is provided in the first region 371a, the first region 371a may also be referred to as a "hole-free region". Since the radiation holes 339 are provided in the second region 371b, the second region 371b may also be referred to as a "perforated region".

Subsequently, a cleaning step according to the third embodiment will be described. When the plasma of the cleaning gas is generated, the rotation of the substrate mounting plate 317 is started. When one of the substrate placing surfaces 311 is moved to a position below the first region 371a, the rotation of the substrate mounting plate 317 is stopped.

When the rotation of the substrate mounting plate 317 is stopped, the one of the substrate placing surfaces 311 is located at the position below the first region 371a, and a part of the substrate non-placing surface 325 is located at a position below the second region 371b. Then, the one of the substrate placing surfaces 311 is not exposed to the plasma, and the substrate non-placing surface 325 outside the one of the substrate placing surfaces 311 is exposed to the plasma. Therefore, it is possible to clean the substrate non-placing surface 325 without etching the substrate placing surfaces 311.

After a predetermined time has elapsed, the substrate mounting plate 317 is rotated. The substrate mounting plate 317 is rotated until another of the substrate placing surfaces 311 is located at the position below the first region 371a. Meanwhile, the substrate non-placing surface 325 between the substrate placing surfaces 311 is exposed to the cleaning gas in the plasma state and cleaned. Although the substrate mounting plate 317 is rotated according to the third embodiment, the third embodiment may also be applied to a state where the region between the adjacent substrate placing surfaces 311 is disposed below the plasma generator 350. For example, the third embodiment may also be applied to a state where the rotation of the substrate mounting plate 317 is stopped as long as the region between the adjacent substrate placing surfaces 311 is disposed below the plasma generator 350.

As described above, by performing the plasma process in accordance with the movement of the substrate placing surfaces 311, it is possible to clean the entire substrate non-placing surface 325 without etching the substrate placing surfaces 311.

OTHER EMBODIMENTS

While the technique is described in detail by way of the above-described first through third embodiments, the above-described technique is not limited thereto. The above-described technique may be modified in various ways without departing from the gist thereof.

According to some embodiments in the present disclosure, it is possible to clean the surrounding structure of the substrate placing surfaces.

What is claimed is:

1. A substrate processing apparatus comprising:
a process chamber in which a substrate is processed;
a substrate mounting plate which is a circular plate having a center and provided with a substrate non-placing surface and a plurality of substrate placing surfaces, the substrate mounting plate including a center region, a middle region and an edge region, wherein the center region is defined by a circle having a center the same as the center of the substrate mounting plate, the middle region includes the plurality of substrate placing surfaces and the center region or the edge region includes the substrate non-placing surface, and none of the substrate placing surfaces are located in the center region;
a rotator configured to rotate the substrate mounting plate;
a plasma generator configured to generate plasma such that a plasma density over the substrate non-placing surface is higher than a plasma density over the plurality of the substrate placing surfaces, the plasma generator comprising:
a dielectric plate;
a slot plate disposed on the dielectric plate and provided with a plurality of radiation holes disposed above the center region, the middle region and the edge region of the substrate mounting plate, wherein one or more of the radiation holes are disposed directly over the center region; and
a microwave supplier;
a process gas supplier configured to supply a process gas into the process chamber;
a cleaning gas supplier configured to supply a cleaning gas into the process chamber; and
a heater placed below the substrate mounting plate,
wherein an opening area per unit area of the plurality of the radiation holes is greater over the center region or the edge region of the substrate mounting plate than over the middle region of the substrate mounting plate such that the opening area per unit area of the plurality of the radiation holes is greater over the substrate non-placing surface than over the plurality of the substrate placing surfaces.

2. The substrate processing apparatus of claim 1, wherein the substrate mounting plate is made of a heat transmissive material that transmits heat.

3. The substrate processing apparatus of claim 2, wherein each of the plurality of the substrate placing surfaces is made of the heat transmissive material.

4. The substrate processing apparatus of claim 3, wherein the process chamber comprises:
a center region located closer to a center of the process chamber than the plurality of the substrate placing surfaces are located;
a middle region located in an outer periphery of the center region of the process chamber, and comprising the plurality of the substrate placing surfaces; and
an edge region extending from outer boundaries of the plurality of the substrate placing surfaces to an edge of the substrate mounting plate, and
wherein the plasma generator is further configured to generate the plasma such that a plasma density over the center region or the edge region of the process chamber is higher than a plasma density over the middle region of the process chamber.

5. The substrate processing apparatus of claim 2, wherein
the center region of the substrate mounting plate is located closer to a center of the process chamber than the plurality of the substrate placing surfaces are located,
the middle region of the substrate mounting plate is located in an outer periphery of the center region, and comprising the plurality of the substrate placing surfaces,
the edge region of the substrate mounting plate extending from outer boundaries of the plurality of the substrate placing surfaces to an edge of the substrate mounting plate, and
the plasma generator is further configured to generate the plasma such that a plasma density over the center region or the edge region of the substrate mounting plate is higher than a plasma density over the middle region of the substrate mounting plate.

6. The substrate processing apparatus of claim 2, further comprising a gate valve provided at the process chamber,
wherein the plasma generator is provided adjacent to the gate valve.

7. The substrate processing apparatus of claim 1, wherein
the center region of the substrate mounting plate is located closer to a center of the process chamber than the plurality of the substrate placing surfaces are located,
the middle region of the substrate mounting plate is located in an outer periphery of the center region, and comprising the plurality of the substrate placing surfaces,
the edge region of the substrate mounting plate extending from outer boundaries of the plurality of the substrate placing surfaces to an edge of the substrate mounting plate, and
the plasma generator is further configured to generate the plasma such that a plasma density over the center region or the edge region of the substrate mounting plate is higher than a plasma density over the middle region of the substrate mounting plate.

8. The substrate processing apparatus of claim 1, wherein
the center region is located closer to a center of the process chamber than the plurality of the substrate placing surfaces are located,
the middle region is located in an outer periphery of the center region, and comprising the plurality of the substrate placing surfaces, and
the edge region extends from outer boundaries of the plurality of the substrate placing surfaces to an edge of the substrate mounting plate.

9. The substrate processing apparatus of claim 8, wherein the substrate mounting plate is made of a heat transmissive material that transmits heat.

10. The substrate processing apparatus of claim 8, wherein each of the plurality of the substrate placing surfaces is made of a heat transmissive material that transmits heat.

11. The substrate processing apparatus of claim 1, further comprising:
a vessel provided adjacent to the plasma generator;
a moving plate; and
a controller configured to control the moving plate,
wherein
the center region of the substrate mounting plate is located closer to a center of the process chamber than the plurality of the substrate placing surfaces are located,
the middle region of the substrate mounting plate is located in an outer periphery of the center region of the substrate mounting plate, and comprising the plurality of the substrate placing surfaces, the edge region of the substrate mounting plate extending from outer boundaries of the plurality of the substrate placing surfaces to an edge of the substrate mounting plate, and the moving plate is configured to move between a space in the vessel and a space on the slot plate, and comprises:

a first portion, when a cleaning process is performed, disposed over the center region or the edge region of the substrate mounting plate and configured to expose one or more of the radiation holes disposed over the center region or the edge region of the substrate mounting plate; and a second portion, when the cleaning process is performed, disposed over the middle region of the substrate mounting plate and configured to block one or more of the radiation holes disposed over the middle region of the substrate mounting plate.

12. The substrate processing apparatus of claim 1, wherein the center region of the substrate mounting plate is located closer to a center of the process chamber than the plurality of the substrate placing surfaces are located, the middle region of the substrate mounting plate is located in an outer periphery of the center region of the substrate mounting plate, and comprising the plurality of the substrate placing surfaces, the edge region of the substrate mounting plate extending from outer boundaries of the plurality of the substrate placing surfaces to an edge of the substrate mounting plate, and the slot plate comprises:

a hole-free region corresponding to one of the substrate placing surfaces and located over the middle region of the substrate mounting plate; and a perforated region comprising the plurality of the radiation holes and located over the center region and the edge region of the substrate mounting plate.

\* \* \* \* \*